(12) United States Patent
Prophet et al.

(10) Patent No.: US 10,950,562 B1
(45) Date of Patent: Mar. 16, 2021

(54) IMPEDANCE-MATCHED THROUGH-WAFER TRANSITION USING INTEGRATED HEAT-SPREADER TECHNOLOGY

(71) Applicant: HRL Laboratories, LLC, Malibu, CA (US)

(72) Inventors: Eric M. Prophet, Santa Barbara, CA (US); Florian G. Herrault, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 3 days.

(21) Appl. No.: 16/559,486

(22) Filed: Sep. 3, 2019

Related U.S. Application Data

(60) Provisional application No. 62/773,653, filed on Nov. 30, 2018.

(51) Int. Cl.
| | | |
|---|---|---|
| *H01L 23/66* | (2006.01) | |
| *H01L 23/367* | (2006.01) | |
| *H01L 23/04* | (2006.01) | |
| *H01L 21/48* | (2006.01) | |
| *H01L 21/768* | (2006.01) | |
| *H01L 21/288* | (2006.01) | |
| *H01L 21/52* | (2006.01) | |

(52) U.S. Cl.
CPC .......... *H01L 23/66* (2013.01); *H01L 21/2885* (2013.01); *H01L 21/4871* (2013.01); *H01L 21/52* (2013.01); *H01L 21/76898* (2013.01); *H01L 23/04* (2013.01); *H01L 23/367* (2013.01); *H01L 2223/6683* (2013.01)

(58) Field of Classification Search
CPC .................... H01L 23/66; H01L 2223/6683
See application file for complete search history.

(56) References Cited

U.S. PATENT DOCUMENTS

| | | |
|---|---|---|
| 3,681,513 A | 8/1972 | Hargis |
| 4,159,221 A | 6/1979 | Schuessler |
| 5,073,521 A | 12/1991 | Braden |
| 5,198,385 A | 3/1993 | Devitt |
| 5,262,351 A | 11/1993 | Bureau |
| 5,276,455 A | 1/1994 | Fitzsimmons |

(Continued)

OTHER PUBLICATIONS

From U.S. Appl. No. 14/286,923 (now published as U.S. Pat. No. 10,079,160), Notice of Allowance dated May 17, 2018.

(Continued)

*Primary Examiner* — David A Zarneke
(74) *Attorney, Agent, or Firm* — Ladas & Parry

(57) ABSTRACT

A microwave electronic component comprising a substrate having top and bottom substrate surfaces; the substrate comprising an aperture between the top and bottom substrate surfaces; a metallic heat sink filling the aperture; a microwave integrated circuit having a top circuit surface with at least one microwave signal port and a bottom circuit surface in contact with the metallic heat sink; a signal line comprising at least a metallic via between the top and bottom substrate surfaces, and a top signal conductor arranged between the microwave signal port and the metallic via; wherein the dimensions and location of the metallic via are chosen such that the metallic via forms, together with the metallic heat sink, a first impedance-matched non-coaxial transmission line.

20 Claims, 7 Drawing Sheets

(56) References Cited

U.S. PATENT DOCUMENTS

| | | | |
|---|---|---|---|
| 5,371,404 | A | 12/1994 | Juskey |
| 5,583,377 | A | 12/1996 | Higgins, III |
| 5,953,594 | A | 9/1999 | Bhatt |
| 6,018,459 | A | 1/2000 | Carlson |
| 6,028,367 | A | 2/2000 | Yu |
| 6,249,439 | B1 | 6/2001 | DeMore et al. |
| 6,900,765 | B2 | 5/2005 | Navarro et al. |
| 6,989,592 | B2 | 1/2006 | Chang et al. |
| 7,015,060 | B1 | 3/2006 | Kubena |
| 7,067,397 | B1 | 6/2006 | Chang-Chien |
| 7,271,479 | B2 | 9/2007 | Zhao |
| 7,292,381 | B1 | 11/2007 | Patterson |
| 7,364,063 | B2 | 4/2008 | Schaenzer |
| 7,683,469 | B2 | 3/2010 | Oh |
| 7,733,265 | B2 | 6/2010 | Margomenos |
| 7,777,315 | B2 | 8/2010 | Noquil |
| 7,808,013 | B2 | 10/2010 | Mendendorp |
| 8,013,434 | B2 | 9/2011 | Lin |
| 8,093,690 | B2 | 1/2012 | Ko |
| 8,178,963 | B2 | 5/2012 | Yang |
| 8,178,964 | B2 | 5/2012 | Yang |
| 8,299,566 | B2 | 10/2012 | Taylor |
| 8,334,592 | B2 | 12/2012 | Bhagwagar |
| 8,375,576 | B2 | 2/2013 | Kwon |
| 8,518,787 | B2 | 8/2013 | Ding |
| 8,617,927 | B1 | 12/2013 | Margomenos |
| 8,644,020 | B2 | 2/2014 | Lau |
| 8,754,522 | B2 | 6/2014 | Meyer et al. |
| 8,759,147 | B2 | 6/2014 | Choi |
| 9,040,420 | B2 | 5/2015 | Sugiyama |
| 9,059,140 | B1 | 6/2015 | Margomenos |
| 9,337,124 | B1 | 5/2016 | Herrault |
| 9,385,083 | B1 | 7/2016 | Herrault |
| 9,508,652 | B1 | 11/2016 | Herrault |
| 9,589,917 | B1* | 3/2017 | Rodriguez ............ H01L 23/481 |
| 10,079,160 | B1 | 9/2018 | Margomenos |
| 10,340,233 | B1* | 7/2019 | Saiz ...................... H01P 11/003 |
| 2003/0006499 | A1 | 1/2003 | Choi |
| 2004/0126931 | A1 | 7/2004 | Hembree |
| 2005/0077596 | A1 | 4/2005 | Bauer |
| 2005/0077614 | A1 | 4/2005 | Chengalva |
| 2005/0155752 | A1 | 7/2005 | Larson |
| 2006/0027635 | A1 | 2/2006 | Schaenzer |
| 2006/0091509 | A1 | 5/2006 | Zhao |
| 2006/0157223 | A1 | 7/2006 | Gelorme |
| 2006/0292747 | A1 | 12/2006 | Loh |
| 2007/0015666 | A1 | 1/2007 | Thieme |
| 2007/0075420 | A1 | 4/2007 | Lu et al. |
| 2007/0247851 | A1 | 10/2007 | Villard |
| 2007/0290326 | A1 | 12/2007 | Yang |
| 2008/0099770 | A1 | 5/2008 | Mendendorp |
| 2008/0128897 | A1 | 6/2008 | Chao |
| 2008/0179725 | A1 | 7/2008 | Chia |
| 2008/0298021 | A1 | 12/2008 | Ali et al. |
| 2009/0108437 | A1 | 4/2009 | Raymond |
| 2009/0134421 | A1 | 5/2009 | Negley |
| 2009/0294941 | A1 | 12/2009 | Oh et al. |
| 2009/0309209 | A1 | 12/2009 | Chen |
| 2010/0140479 | A1 | 6/2010 | Do |
| 2010/0283144 | A1 | 11/2010 | Liang |
| 2010/0285637 | A1 | 11/2010 | Khan |
| 2010/0320588 | A1 | 12/2010 | Dahilig |
| 2010/0327465 | A1 | 12/2010 | Shen et al. |
| 2011/0049558 | A1 | 3/2011 | Lin |
| 2011/0059578 | A1 | 3/2011 | Lin |
| 2011/0291249 | A1 | 12/2011 | Chi |
| 2012/0129298 | A1 | 5/2012 | Lin |
| 2012/0139095 | A1 | 6/2012 | Manusharow |
| 2012/0217627 | A1 | 8/2012 | Tseng et al. |
| 2012/0241942 | A1 | 9/2012 | Ihara |
| 2012/0276403 | A1 | 11/2012 | Nakagawa |
| 2013/0093085 | A1 | 4/2013 | Seah |
| 2013/0175676 | A1* | 7/2013 | Shin .................. H01L 23/53276 257/664 |
| 2014/0084445 | A1 | 3/2014 | Lin |
| 2014/0110858 | A1* | 4/2014 | Beer ...................... H01L 24/24 257/774 |
| 2014/0332974 | A1 | 11/2014 | Schuckman |
| 2015/0007965 | A1 | 1/2015 | Joshi |
| 2015/0364816 | A1* | 12/2015 | Murugan ................ H01L 23/66 343/905 |
| 2015/0380343 | A1* | 12/2015 | Koontz ................. H01L 23/562 257/621 |
| 2016/0293557 | A1* | 10/2016 | Topak ................. H01L 23/5389 |
| 2020/0344874 | A1* | 10/2020 | Asahi ..................... H05K 1/115 |

OTHER PUBLICATIONS

From U.S. Appl. No. 14/286,923 (now published as U.S. Pat. No. 10,079,160), Office Action dated May 17, 2017.

From U.S. Appl. No. 14/286,923 (now published as U.S. Pat. No. 10,079,160), Office Action dated Nov. 1, 2016.

Boone, J., et al., "Development of a through wafer 3D vertical micro-coaxial probe," Published Jun. 12, 2013, 2013 IOP Publishing Ltd., Journal of Micromechanics and Microengineering, vol. 23, No. 7.

Brown, D.F. et al., "High-speed, enhancement-mode GaN power switch with regrown n+ GaN ohmic contacts and staircase field plates," IEEE Electron Device Letters, vol. 34, No. 9, pp. 1118-1120, Sep. 2013.

Chang-Chien, P. et al., "MMIC Packaging and Heterogeneous Integration Using Wafer-Scale Assembly," CS Mantech Conference, pp. 143-146, (May 14-17, 2007).

Chen, K.C., et al., "Thermal Management and Novel Package Design of High Power Light Emitting Diodes", National Kung University, Taiwan, Electronic Components and Technology Conference, 2008.

Ejeckam, F. et al., "Diamond for enhanced GaN device performance," in Proc. IEEE Intersociety Conference on Thermal and Thermomechanical Phenomena in Electronic Systems (ITherm), Orlando, FL, May 27-30, 2014, pp. 1206-1209.

Faqir, M. et al., "Improved thermal management for GaN power electronics: Silver diamond composite packages," Microelectronics Reliability, vol. 52, Issue 12, pp. 3022-3025, 2012.

Feeler, R., et al., "Next-Generation Microchannel Coolers", Northrop Grumman, Proceedings of SPIE 2008, vol. 6876, 8 pages.

Herrault, et al., "Silicon-packaged GaN power HEMTs with integrated heat spreaders," Electronic Components and Technology Conference (ECTC), 2015 IEEE 65th, Conference: May 26-29, 2015.

Kollman, Daniel T., et al. "Ultra-wideband silicon through-wafer transmission lines," Conference Paper in IEEE MTT-S International Microwave Symposium digest. IEEE MTT-S International Microwave Symposium 2:489-492 vol. 2 • Jul. 2004.

Margomenos A. et al., "Novel Packaging, Cooling and Interconnection Method for GaN High Performance Power Amplifiers and GaN Based RF Front-Ends," Proceedings of the 7th European Microwave Integrated Circuits Conference, pp. 615-618, (Oct. 29-30, 2012).

Margomenos, A. et al. for "Wafer-Level Packaging Method Incorporating Embedded Thermal Management for GaN-Based RF Front-Ends," IEEE Intersociety Conference on Thermal and Thermomechanical Phenomena in Electronic Systems (ITHERM), May 27-30, 2014 in Orlando, Florida (6 pages).

Margomenos, A. et al., "X-Band Highly Efficient GaN Power Amplifier Utilizing Built-In Electroformed Heat Sinks for Advanced Thermal Management," IEEE International Microwave Symposium, 2013 (4 pages).

Nochetto, H.C. et al., "GaN HEMT junction temperature dependence on diamond substrate anisotropy and thermal boundary resistance," in Proc. IEEE Compound Semiconductor Integrated Circuit Symposium (CSICS), La Jolla, CA, Oct. 14-17, 2012, pp. 1-4.

Ryu, C., et al., "High Frequency Electrical Model of Through Wafer Via for 3-D Stacked Chip Packaging," 2006 1st Electronics Systemintegration Technology Conference, 2006 (6 pages).

(56) References Cited

OTHER PUBLICATIONS

Shinohara, K. et al., "Scaling of GaN HEMTs and Schottky diodes for submillimeter-wave MMIC applications," IEEE Trans. Electron Devices, vol. 60, No. 10, pp. 2982-2996, 2013.
Woo et al., "Effects of Various Metal Seed Layers on the Surface Morphology and Structural Composition of the Electroplated Copper Layer," Apr. 2009, Metals and Materials International, vol. 15, No. 2, pp. 293-297.
www.eeweb.com/tools/embedded-microstrip-impedance (printed: Nov. 1, 2019).

* cited by examiner though-wafer 3D vertical micro-coaxial probe", by Justin Boone et al., 2013 J. Micromech. Microeng. 23 075029, discloses a through-wafer 3D vertical micro-coaxial probe flushed in a silicon substrate. The Boone reference is incorporated by reference as though fully set forth herein. The probe was designed using radio frequency (RF) calculations and consists of 100 µm inner diameter and 300 µm outer diameter vias, which corresponds to a 1:3 inner/outer conductor ratio. Fabrication results indicate that the probe through holes can be formed using standard photolithography techniques and Bosch's process for deep reactive ion etching. The probe vias were successfully metalized with a diluted silver paste. Measured results demonstrate that the probe has good signal transmission with a reflection coefficient less than −10 dB from 15 to 57 GHz. By developing an RF based three-dimensional micro-coaxial probe, its use as vertical interconnects in high frequency system-in-package technologies have considerably improved.

FIG. 1 is a top view of a micro-coaxial probe or transmission line 10 formed on a substrate 12 as described in the Boone reference, comprising a coaxial transmission line 14 having: a central cylindrical via 16 that passes though substrate 12 along an axis normal to the surfaces of substrate 12 and has a first outer diameter; and an outer tubular via 18 that has a same axis as central via 16 and has an inner diameter larger than the first outer diameter, thus leaving a tubular section 20 of material of the substrate 12 between the central via 16 and the outer via 18. To allow manufacturing, tubular substrate section 20 is continuously connected to the remainder of substrate 12 by substrate sections 22. To achieve this, outer via 18 actually comprises two distinct tubular sections 18', 18" arranged on both sides of substrate sections 22. Through-substrate transmission line 14 is connected to a transmission line 24 that comprises a central conductive strip 24' formed on a top surface of substrate 12 over one substrate section 22 to contact a top surface of central via 16, between two conductive strip 24" formed on the top surface of substrate 12 to contact a top surface of each of tubular sections 18' and 18". A conductive strip 26 formed above the substrate section 22 not covered by conductor 24' contacts a top surface of each of tubular sections 18' and 18". In operation, the conductive strips 24" are connected to the ground and a signal is sent on conductive strip 24'.

A problem with a vertical coaxial transmission line 14 such as illustrated in FIG. 1 is that its dimensions cannot be reduced beyond a given limit without impairing the electrical properties of the transmission line. It follows that such vertical coaxial transmission lines can be ill-suited for high scale integration.

SUMMARY

This presentation provides for using a through-wafer electrically conductive heat sink as a first conductor of a non-coaxial through-wafer transmission line, and using as a second conductor of said non-coaxial through-wafer transmission line a through-wafer via having its dimensions and location carefully chosen to confer a matched impedance to the non-coaxial transmission line. A first port of the transmission line is formed between the heat sink and a first end of the via, whereas a second port of the transmission line is formed between the heat sink and a second end of the via.

This presentation also provides using at least one such non-coaxial through-wafer transmission line in a microwave electronic component.

This presentation also provides for a method of manufacturing such a non-coaxial through-wafer transmission line or such a microwave electronic component.

An embodiment of this presentation comprises a microwave electronic component having: a substrate having top and bottom substrate surfaces; the substrate comprising an aperture between the top and bottom substrate surfaces; a metallic heat sink filling the aperture; a microwave integrated circuit having a top circuit surface with at least one microwave signal port and a bottom circuit surface in contact with the metallic heat sink; a signal line comprising at least a metallic via between the top and bottom substrate surfaces, and a top signal conductor arranged between the microwave signal port and the metallic via; wherein the dimensions and location of the metallic via are chosen such that the metallic via forms, together with the metallic heat sink, a first impedance-matched non-coaxial transmission line.

According to an embodiment of this presentation, said top substrate surface comprises a top ground plane conductor in contact with the metallic heat sink and said top signal conductor is arranged at least partially on the top substrate surface such that said top signal conductor forms, together with the top ground plane conductor, a second impedance-matched non-coaxial transmission line.

According to an embodiment of this presentation, said top ground plane conductor is arranged to form a ground-signal-ground topology together with said top signal conductor.

According to an embodiment of this presentation, said bottom substrate surface comprises a bottom ground plane conductor in contact with the metallic heat sink and the signal line further comprises a bottom signal conductor arranged on the bottom substrate surface such that said bottom signal conductor forms, together with the bottom ground plane conductor, a third impedance-matched non-coaxial transmission line.

According to an embodiment of this presentation, said bottom ground plane conductor is arranged to form a ground-signal-ground topology together with said bottom signal conductor.

According to an embodiment of this presentation, said microwave integrated circuit is embedded in the metallic heat sink such that said top circuit surface is flush with said top substrate surface.

According to an embodiment of this presentation, said top signal conductor forms a bridge over a portion of the metallic heat sink located between the signal port and the metallic via.

According to an embodiment of this presentation, said at least one microwave signal port is one of an input port and an output port.

According to an embodiment of this presentation, the microwave electronic component comprises a cap attached to the top substrate surface over the microwave integrated circuit; the cap comprising a recess arranged such that the cap does not contact the microwave integrated circuit.

According to an embodiment of this presentation, said dimensions and location of the metallic via comprise: a thickness and width of the metallic via in a plane parallel to the top and bottom substrate surfaces; a distance between the metallic via and a closest wall of the metallic heat sink in said plane along a direction normal to said closest wall of the metallic heat sink; and a distance between the metallic via and a lateral edge of the substrate along said direction.

According to an embodiment of this presentation, the first impedance-matched non-coaxial transmission line has a characteristic impedance of 50 Ohm+/−5%.

Other embodiments of this presentation comprise a method of manufacturing a microwave electronic component, the method comprising: fabricating a substrate having top and bottom substrate surfaces; the substrate comprising an aperture between the top and bottom substrate surfaces; positioning in said aperture a microwave integrated circuit having a top circuit surface with at least one microwave signal port such that the top circuit surface and top substrate surface are flush; filling the remainder of said aperture with a metallic heat sink such that at least a bottom surface of said microwave integrated circuit is in contact with the metallic heat sink; forming a signal line comprising at least a metallic via between the top and bottom substrate surfaces, and a top signal conductor arranged between the microwave signal port and the metallic via; wherein the dimensions and location of the metallic via are chosen such that the metallic via forms, together with the metallic heat sink, a first impedance-matched non-coaxial transmission line.

According to an embodiment of this presentation, the method further comprises forming on said top substrate surface a top ground plane conductor in contact with the metallic heat sink, wherein said top signal conductor is arranged at least partially on the top substrate surface such that said top signal conductor forms, together with the top ground plane conductor, a second impedance-matched non-coaxial transmission line.

According to an embodiment of this presentation, the method further comprises arranging said top ground plane conductor to form a ground-signal-ground topology together with said top signal conductor.

According to an embodiment of this presentation, the method further comprises forming on said bottom substrate surface a bottom ground plane conductor in contact with the metallic heat sink; wherein said forming a signal line further comprises forming on the bottom substrate surface a bottom signal conductor arranged to form, together with the bottom ground plane conductor, a third impedance-matched non-coaxial transmission line.

According to an embodiment of this presentation, the method further comprises arranging said bottom ground plane conductor to form a ground-signal-ground topology together with said bottom signal conductor.

According to an embodiment of this presentation, the method further comprises forming said top signal conductor as a bridge over a portion of the metallic heat sink located between the signal port and the metallic via.

According to an embodiment of this presentation said at least one microwave signal port is one of an input port and an output port.

According to an embodiment of this presentation, the method further comprises attaching to the top substrate surface, over the microwave integrated circuit, a cap comprising a recess arranged such that the cap does not contact the microwave integrated circuit.

According to an embodiment of this presentation, said dimensions and location of the metallic via comprise: a thickness and width of the metallic via in a plane parallel to the top and bottom substrate surfaces; a distance between the metallic via and a closest wall of the metallic heat sink in said plane along a direction normal to said closest wall of the metallic heat sink; and a distance between the metallic via and a lateral edge of the substrate along said direction.

According to an embodiment of this presentation, the method further comprises forming simultaneously the metallic heat sink and metallic via using an electroplating process.

BRIEF DESCRIPTION OF THE DRAWINGS

Aspects of the present invention are illustrated by way of example, and not by way of limitation, in the accompanying drawings.

Figure 1:
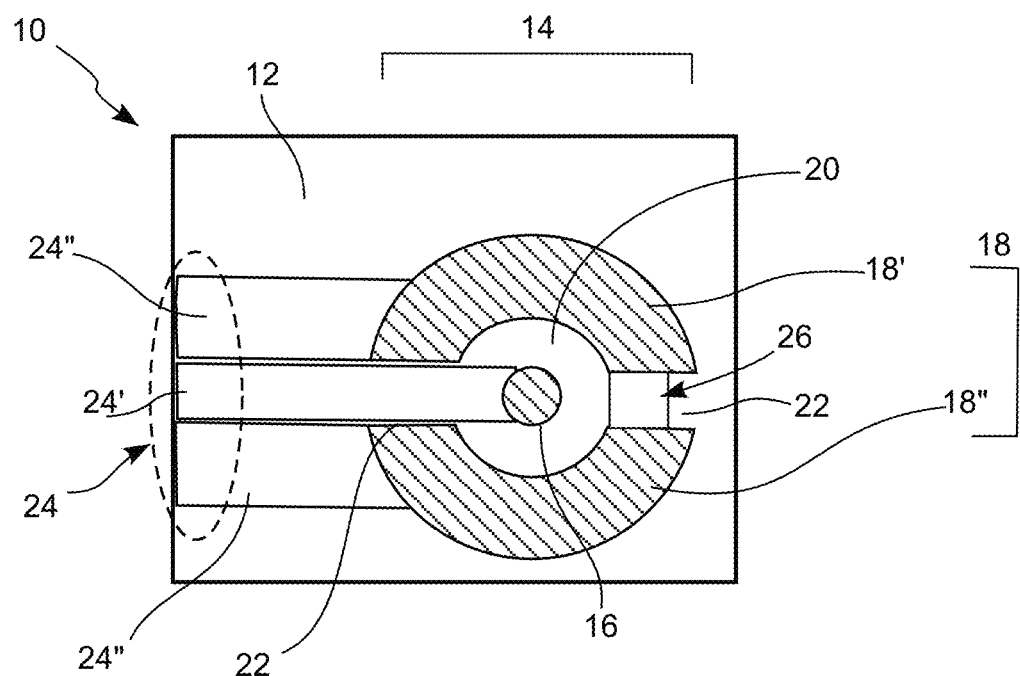
FIG. 1 illustrates a coaxial through-substrate transmission line.

The drawings referred to in this description should be understood as not necessarily being drawn to scale.

DETAILED DESCRIPTION

The Inventors have discovered that the intrinsic electrical grounding property of a through-substrate heat spreader according to a technology developed by HRL can be used to optimize the impedance characteristics of a via passing through the substrate, thus forming with the via a non-coaxial matched impedance transmission line. Impedance matching is the practice of designing the input impedance of an electrical load or the output impedance of its corresponding signal source to maximize the power transfer or minimize signal reflection from the load. In the present application, the term "transmission line" is used to describe a specialized structure designed to conduct alternating currents with a frequency high enough that their wave nature must be taken into account. Ordinary electrical cables suffice to carry low frequency alternating current (AC), such as mains power, which reverses direction 100 to 120 times per second, and audio signals. However, ordinary electrical cables cannot be used to carry currents in the radio frequency range, above about 30 kHz, because the energy tends to radiate off the cable as radio waves, causing power losses. Radio frequency currents also tend to reflect from discontinuities in the cable such as connectors and joints, and travel back down the cable toward the source. These reflections act as bottlenecks, preventing the signal power from reaching the destination. Transmission lines use specialized construction, and impedance matching, to carry electromagnetic signals with minimal reflections and power losses.

The heat-spreader technology developed by HRL is for example disclosed in U.S. Pat. Nos. 8,617,927; 9,385,083 and 10,079,160. These references are incorporated by reference as though fully set forth herein.

U.S. Pat. No. 8,617,927 to Margomenos, issued on Dec. 31, 2013, discloses a method and apparatus for mounting microelectronic chips to a thermal heat sink. The chips are arranged in a desired configuration with their active faces all facing a common direction and with their active faces defining a common planar surface for all of said chips. A metallic material is applied to the chip, preferably by electroplating to backsides of the chips, the metallic material being electro-formed thereon and making void-free contact with the backsides of the chips.

U.S. Pat. No. 9,385,083 to Herrault, issued on Jul. 5, 2016, discloses an interconnect for electrically coupling pads formed on adjacent chips or on packaging material adjacent the chips, with an electrically conductive heat sink being disposed between the pads, the interconnect comprising a metallic membrane layer disposed between two adjacent pads and disposed or bridging over the electrically conductive heat sink so as to avoid making electrical contact with the electrically conductive heat sink. An electroplated metallic layer is disposed on the metallic membrane layer. Fabrication of interconnect permits multiple interconnects to be formed in parallel using fabrication techniques compatible with wafer level fabrication of the interconnects. The interconnects preferably follow a smooth curve to electrically connect adjacent pads and following that smooth curve they bridge over the intervening electrically conductive heat sink material in a predictable fashion.

U.S. Pat. No. 10,079,160 to Margomenos, issued on Sep. 18, 2018, (herein after identified as the '160 patent) discloses a method of mounting one or more semiconductor or microelectronic chips, which includes providing a carrier; temporarily adhering the one or more semiconductor or microelectronic chips to the carrier with active faces of the one or more chips facing towards the carrier; providing a package body with at least one chip-receiving opening therein and with at least one contact opening therein; temporarily adhering the package body to the carrier with the at least one opening in the package body accommodating at least a portion of the one or more chips; covering backsides of the one or more chips and filling empty spaces between the one or more chips and walls of the at least one opening in the package body with a metallic material; filling the at least one contact opening with the aforementioned metallic material; wirebonding contacts on the active faces of the one or more chips with contact surfaces in electrical communication with the metallic material in the at least one contact opening; and releasing package body with the one or more chips embedded in the metallic material from the carrier.

Figure 2:
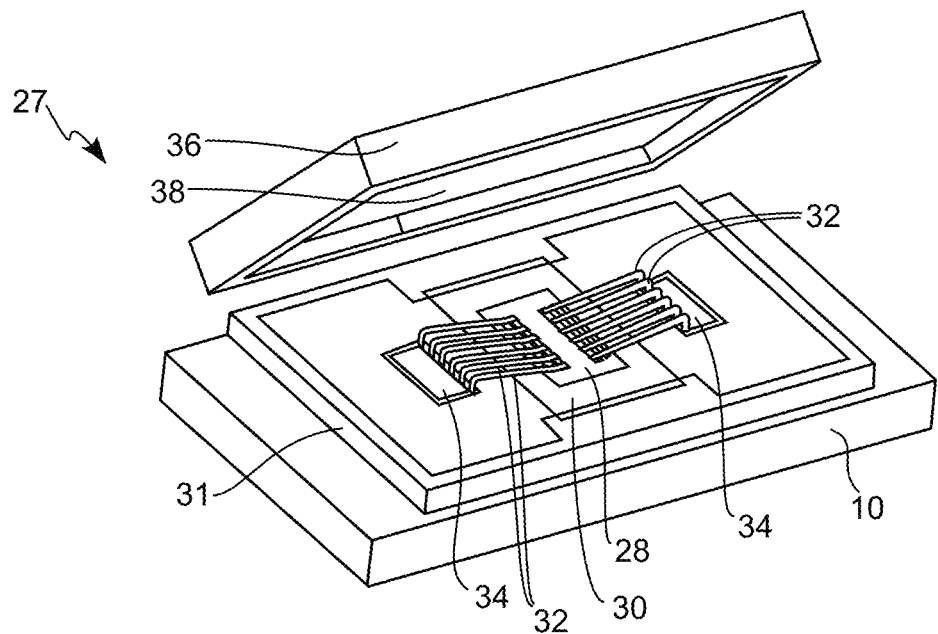
FIG. 2 illustrates an electronic component comprising a through-wafer electrically conductive heat sink and through-wafer vias.

FIG. 2 illustrates an electronic component 27 according to '160 patent, that comprises a chip 28 surface-embedded in an electroformed heat sink 30 formed through a substrate 31, with wirebonds 32 connecting pads on top of chip 28 to through-substrate vias 34. The figure also shows a cover 36 before assembly, having a package cavity 38 and arranged for being attached to substrate 31 so as to encapsulate chip 28 and wirebonds 32 without contacting them.

Embodiments of this presentation use a heat-spreader or heat sink such as heat sink 30 of FIG. 2 as an electrical ground plane to create a through-substrate embedded microstrip waveguide that can be optimized by means of its size and proximity. Though the present embodiment utilizes heat-spreader technology to provide an electrical ground, the concept could also be extended to electrical groundings that are not categorized as heat spreaders. The present invention could also be used for optimization and transmission of high speed DC bias signals.

The reader will note in this discussion that the transverse embedded microstrip waveguide (or through-substrate via) forms, together with the heat sink, an impedance matched transmission line from the top of the package body to the bottom of the package body. A first port of the transmission line is formed between the heat sink and a first end of the via, whereas a second port of the transmission line is formed between the heat sink and a second end of the via.

According to embodiments of this presentation, the impedance of the via can be tuned to optimize the energy transfer depending on the dimensions of the via and its proximity to the ground-plane (in this case, the heat spreader). Once the dimensions of the substrate and through-substrate heat sink are determined, an ordinary transmission line calculator (such as the one shown in FIG. 4 which is later discussed) can be used to properly size and place the through-substrate via with respect to the heat spreader to provide optimum power transfer from the internal packaged device to the electrical connections on the outside of the package.

The through-substrate embedded microstrip/via is preferably formed by the same or similar means and at the same time as the heat spreader is formed. This can be achieved by mechanical machining, laser ablation or isotropic etching depending on the material of the substrate. The embedded microstrip/via can then be filled by electroplating along with the heat spreader to make electrical connections between the top and bottom surfaces of the substrate. As detailed hereafter, according to embodiments of this presentation, the embedded microstrip/via can be connected to the MMIC and backside bonding pads using waveguide technologies such as but not limited to the use of a microstrip for lower frequencies (<20 MHz), or Co-Planar-Waveguide (CPW) waveguide technology for higher frequencies.

The detailed description set forth below in connection with the appended drawings are intended as a description of various embodiments of the present invention and are not intended to represent the only embodiments in which the present invention is to be practiced. Each embodiment described in this disclosure is provided merely as an example or illustration of the present invention, and should not necessarily be construed as preferred or advantageous over other embodiments. In some instances, well-known methods, procedures, objects, and circuits have not been described in detail so as to not unnecessarily obscure aspects of the present disclosure.

Figure 3:
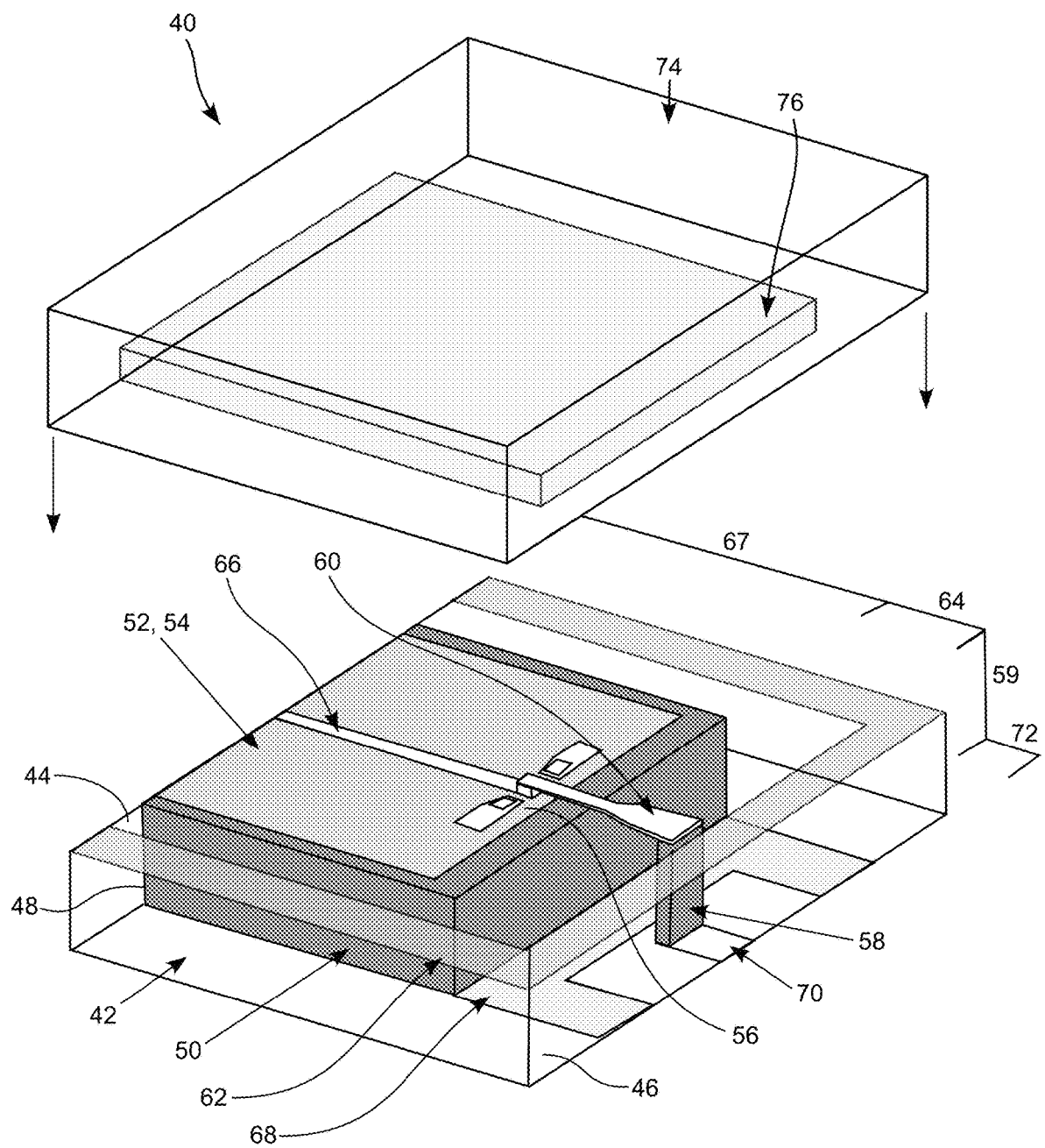
FIG. 3 illustrates a portion of a microwave electronic component having a non-coaxial through-substrate transmission line according to embodiments of this presentation.

FIG. 3 is a perspective view of a portion of a microwave electronic component 40 according to embodiments of this presentation, comprising: a substrate 42 (for example Si) having a top substrate surface 44 and a bottom substrate surface 46; the substrate comprising an aperture 48 between the top and bottom substrate surfaces and a metallic heat sink 50 filling the aperture. A microwave integrated circuit 52 (e.g. MMIC) has a top circuit surface 54 with at least one microwave signal port 56 and a bottom circuit surface (see in FIG. 6) in contact with the metallic heat sink 50. According to embodiments of this presentation, the microwave integrated circuit 52 is embedded in the metallic heat sink 50 such that the top circuit surface 54 is flush with the top substrate surface 44. According to embodiments of this presentation, component 40 further comprises a signal line comprising at least: a metallic via 58 between the top substrate surface 44 and the bottom substrate surface 46, and a top signal conductor 60 arranged between the microwave signal port 56 and the metallic via 58. According to embodiments of this presentation, the dimensions and location of the metallic via 58 are chosen such that the metallic via 58 forms, together with the metallic heat sink 50, a first impedance-matched non-coaxial transmission line 59, where a first port of the transmission line 59 is formed between for example a top surface of the heat sink 50 and a top end of the via 58, and a second port of the transmission line 59 is formed between a bottom surface of the heat sink 50 and a bottom end of the via 58. In FIG. 3, via 58 is illustrated as having a rectangular cross-section in a plane parallel to the top and bottom surfaces of the substrate 42. According to embodiments of this presentation, the characteristic impedance of the transmission line can be of 50 Ohm.

According to embodiments of this presentation, the top substrate surface 44 comprises a top ground plane conductor 62 in contact (not shown in FIG. 3) with the metallic heat sink 50 and at least a portion of the top signal conductor 60 is arranged on the top substrate surface 44 such that top signal conductor 60 forms, together with portions of the top ground plane conductor 62, a second impedance-matched non-coaxial transmission line 64. According to embodiments of this presentation, top ground plane conductor 62 is arranged to form a ground-signal-ground topology transmission line together with top signal conductor 60. According to embodiments of this presentation, top signal conductor 60 is arranged to not contact heat sink 50, and for example comprises a portion that forms a bridge (air or dielectric) over a portion of the metallic heat sink 50 located between the signal port 56 and the metallic via 58.

As illustrated in FIG. 3, a microstrip line 66 can be arranged on the top surface 54 of circuit 52 at an end of top signal conductor 60, for example to connect a further port (not shown in FIG. 3) of circuit 52. According to embodiments of this presentation, top ground plane conductor 62 is arranged to form a ground-signal-ground topology transmission line 67 together with microstrip line 66.

According to embodiments of this presentation, bottom substrate surface 46 comprises a bottom ground plane conductor 68 in contact with the metallic heat sink 50, and the signal line further comprises a bottom signal conductor 70 arranged on the bottom substrate surface 46 such that bottom signal conductor 70 forms, together with the bottom ground plane conductor 68, a third impedance-matched non-coaxial transmission line 72. According to embodiments of this presentation, the bottom ground plane conductor 68 is arranged to form a ground-signal-ground topology transmission line together with the bottom signal conductor 70.

According to embodiments of this presentation, a cap 74 is attached to the top substrate surface 44 over the microwave integrated circuit 52, the cap 74 comprising a recess 76 arranged such that the cap 74 encapsulates integrated circuit 52 and top conductor 60 without contacting them. For clarity of the drawing, the cap 74 is illustrated not attached to the top substrate surface 44.

According to embodiments of this presentation, each of transmissions lines 59, 64, 67 and 72 is arranged to have a same characteristic impedance that is matched to that of the load impedance for the component, for example of 50 Ohm. According to embodiments of this presentation, each of transmissions lines 59, 64, 67 and 72 is preferably arranged to have a characteristic impedance within 5% of said same characteristic impedance; for example 50 Ohm+/−5%.

According to embodiments of this presentation, each of transmissions lines 59, 64, 67 and 72 is preferably arranged to have a characteristic impedance within 3% of said same characteristic impedance; for example 50 Ohm+/−3%.

According to embodiments of this presentation, each of transmissions lines 59, 64, 67 and 72 is preferably arranged to have a characteristic impedance within 1% of said same characteristic impedance; for example 50 Ohm+/−1%.

According to embodiments of this presentation, a number of contact or bonding pads (not shown in FIG. 3) are patterned on the bottom surface 46 for external electrical connections.

Figure 4:
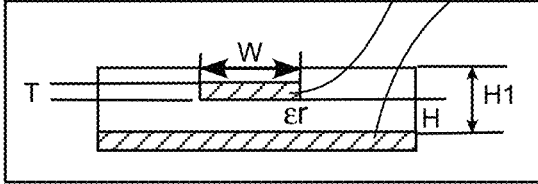
FIG. 4 illustrates a calculation tool for making a non-coaxial through-substrate transmission line according to embodiments of this presentation.

FIG. 4 illustrates a typical impedance calculator that can be used to determine the proper dimensions of an embedded microstrip waveguide/via 58 to according to embodiments of this presentation, such that the transmission line formed with the via and the heat sink 50 has a predetermined, adapted, characteristic impedance. In FIG. 4, the large lower black line represents a wall of the heat sink 50 (connected to ground) which is the closest to where via 58 is desired (e.g. the wall closest to where signal port 56 is located on the surface of chip 52). Thus, the plane of FIG. 4 is parallel to the top or bottom substrate surface 44 or 46 of substrate 42.

The top black line in FIG. 4 represents a cross section of via 58 in the plane of FIG. 4, where it has a thickness (T, in a direction normal to the illustrated wall of the heat sink 50) and a width (W, in a direction parallel to the illustrated wall of the heat sink 50). According to embodiments of this presentation, the width W of metallic via 58 must be at least ten times smaller than the width of the heat sink 50 in the same direction. The height (H) in FIG. 4 is the distance between the illustrated wall of the heat sink 50 and the closest edge of via 58. The dielectric thickness (H1) is the distance between the illustrated wall of the metallic via 50 and a lateral edge of the substrate 42 along the plane of FIG. 4. The relative permittivity of the dielectric ($\varepsilon_r$) is an electrical characteristic of the material of substrate 42. By inputting the design criteria data above, one can use this type of tool to determine the optimum dimensions to have a desired characteristic impedance for the transmission line formed by via 58 and heat sink 50; for example 50 Ohms. According to embodiments of this presentation, similar tools can be used to determine the optimum dimensions of conductors 60, 66 and 70 to have transmission lines 59, 64, 67 and 72 with matched impedances all along the signal line of the component, and minimize the power reflections due to impedance mismatch along that line. Such a calculation tool is for example available at: www.eeweb.com/tools/embedded-microstrip-impedance According to embodiments of this presentation, the length of via 58 is not used in the calculation of the characteristic impedance. According to embodiments of this presentation, the dimensions of via 58 can be small and via 58 can be arranged close to heat sink 50, thus allowing efficient integration of the matched impedance transmission line formed by via 58 and heat sink 50. According to embodiments of this presentation, the dimension of via 58 is determined largely by the thickness of the substrate (H1 in FIG. 4), and is calculated using the calculation tool. The goal of the tool is to find a via dimension 58 that has a predetermined characteristic impedance (e.g. of 50-ohms) for a given distance from the heat spreader (H1). It is to be noted that as long as the via 58 remains at the calculated distance (H) from the heat spreader/heat sink 50, the length of the via 58 is not critical. The characteristic impedance of the transmission line that comprises the via remains the same (e.g. 50-ohms) and can be as long as necessary.

Figure 5:
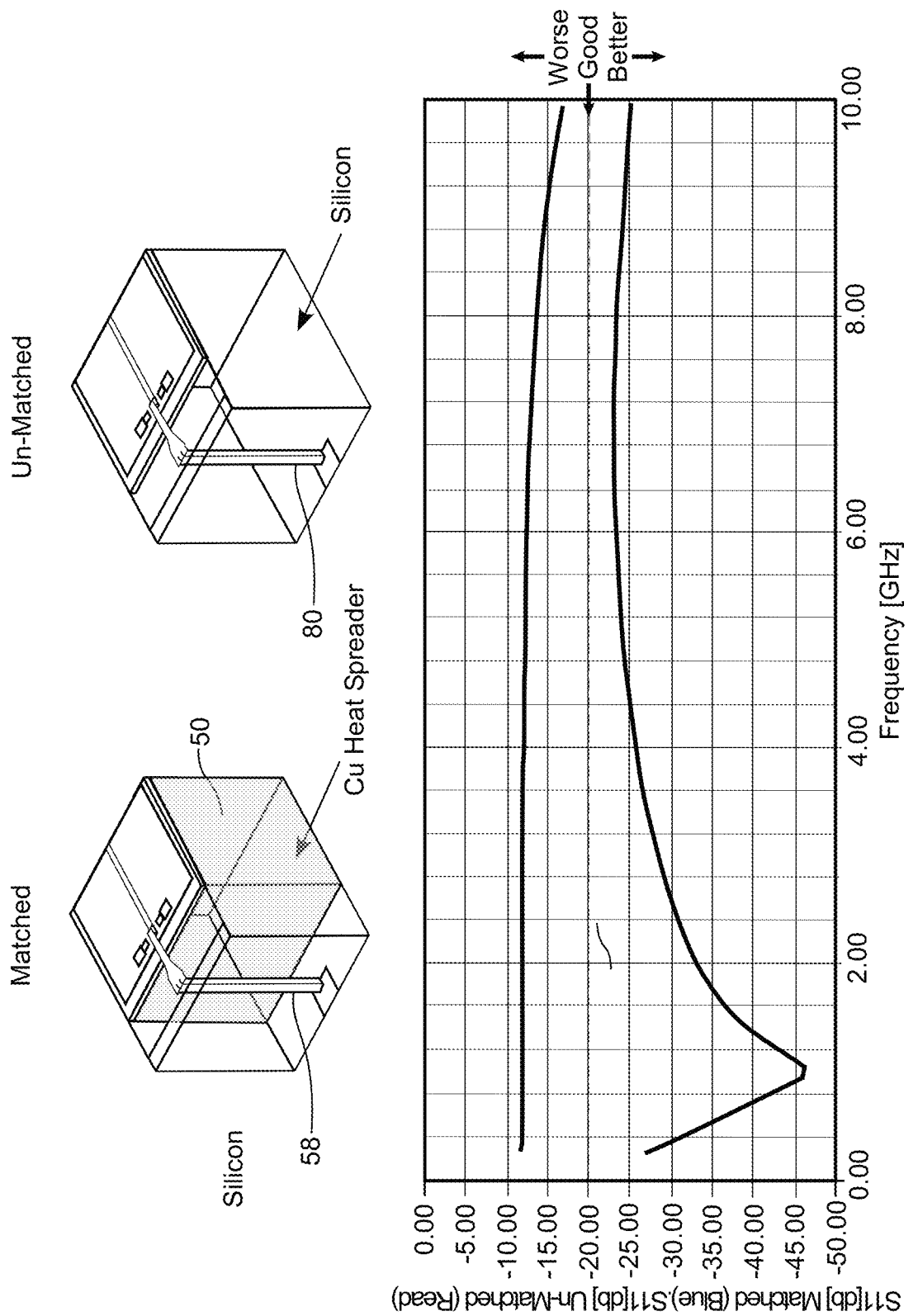
FIG. 5 illustrates the performance of a non-coaxial through-substrate transmission line according to embodiments of this presentation.

FIG. 5 illustrates shows simulation results comparing the performance of a through-substrate non-coaxial transmission line according to embodiments of this presentation, as illustrated for example in FIG. 3 (illustrated in the top left corner of FIG. 5), to the performance of a known through-substrate via 80 of same dimensions and position (but with no heat sink 50, illustrated in the top right corner of FIG. 5). The graph in the bottom part of FIG. 5 shows the S11 or reflection parameters for both cases. The trace nearer the bottom of the graph represents the matched case according to embodiments of this presentation, and the trace above represents the unmatched case. The model and simulation thus shows that the transmission lines comprising conductors 60, 58 and 70, from the MMIC 52 to the bottom of the component, have a nearly negligible effect on the overall performance of the MMIC 52, when the impedance of these conductors is fine-tuned according to this presentation to fabricate non-coaxial impedance-matched transmission lines.

In the embodiment illustrated in FIG. 5, the signal line that uses the transmission line comprising via 58 and heat sink 50 is nearly perfectly matched from DC to 10 GHz and is, at some frequencies, many orders of magnitude better than the non-matched case. A possible advantage of embodiments of this presentation is that the transmission lines in the signal line can be matched even as the lines becomes long. For the case without heat sink 50, the performance is degraded in the same frequency range and are expected to continue to degrade as the conductors of the signal lines become longer. It is noted that for clarity FIG. 5 does not illustrate the cap attached to the top surface of the substrate.

The foregoing is now again set forth in greater detail with the following numbering summary being helpful.

Figure 6:
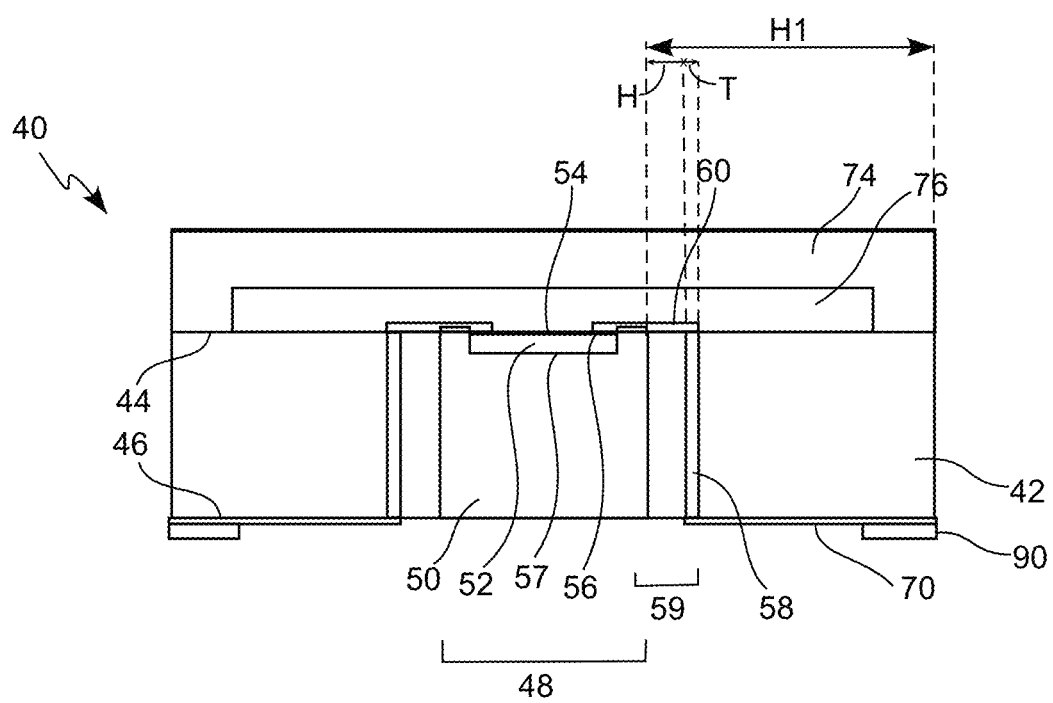
FIG. 6 illustrates a microwave electronic component having a non-coaxial through-substrate transmission line according to embodiments of this presentation.

FIG. 6 is a cross-section of a component according to embodiments of the present disclosure, such as illustrated in FIG. 3, along a plane normal to the top substrate surface. Similar reference numerals represent similar features in FIGS. 3 and 6. Component 40 comprises, as illustrated, substrate 42 with top and bottom substrate surfaces 44, 46; the substrate 42 comprising an aperture 48 between the top and bottom substrate surfaces 44, 46. Metallic heat sink 50 fills aperture 48, and integrated circuit 52, having a top circuit surface 54 with at least one microwave signal port 56, is embedded in heat sink 50 such that at least a bottom circuit surface 57 contacts the metallic heat sink 50. A signal line comprises metallic via 58, between the top and bottom substrate surfaces 44, 46, and top signal conductor 60, arranged between the microwave signal port 56 and the metallic via 58; where the dimensions and location of the metallic via 58 (including values H, H1 and T as shown in FIG. 6) are chosen such that the metallic via 58 forms, together with the metallic heat sink 50, an impedance-matched non-coaxial transmission line 59 as detailed above. Bottom substrate surface 46 comprises bottom signal conductor 70, having an end in contact with metallic via 58 and another end in contact with a pad 90 formed on bottom substrate surface 46 for electrical connection of component 40. Cap 74 is not shown in FIG. 6.

According to embodiments of this presentation, heat sink 50 and via 58 can be filled with copper. Only one signal port 56 connected to one signal line have been described here above, but embodiments of this presentation also provide for a circuit 52 having more than one signal port, each signal port being connected to a signal line such as detailed previously.

Figure 7:
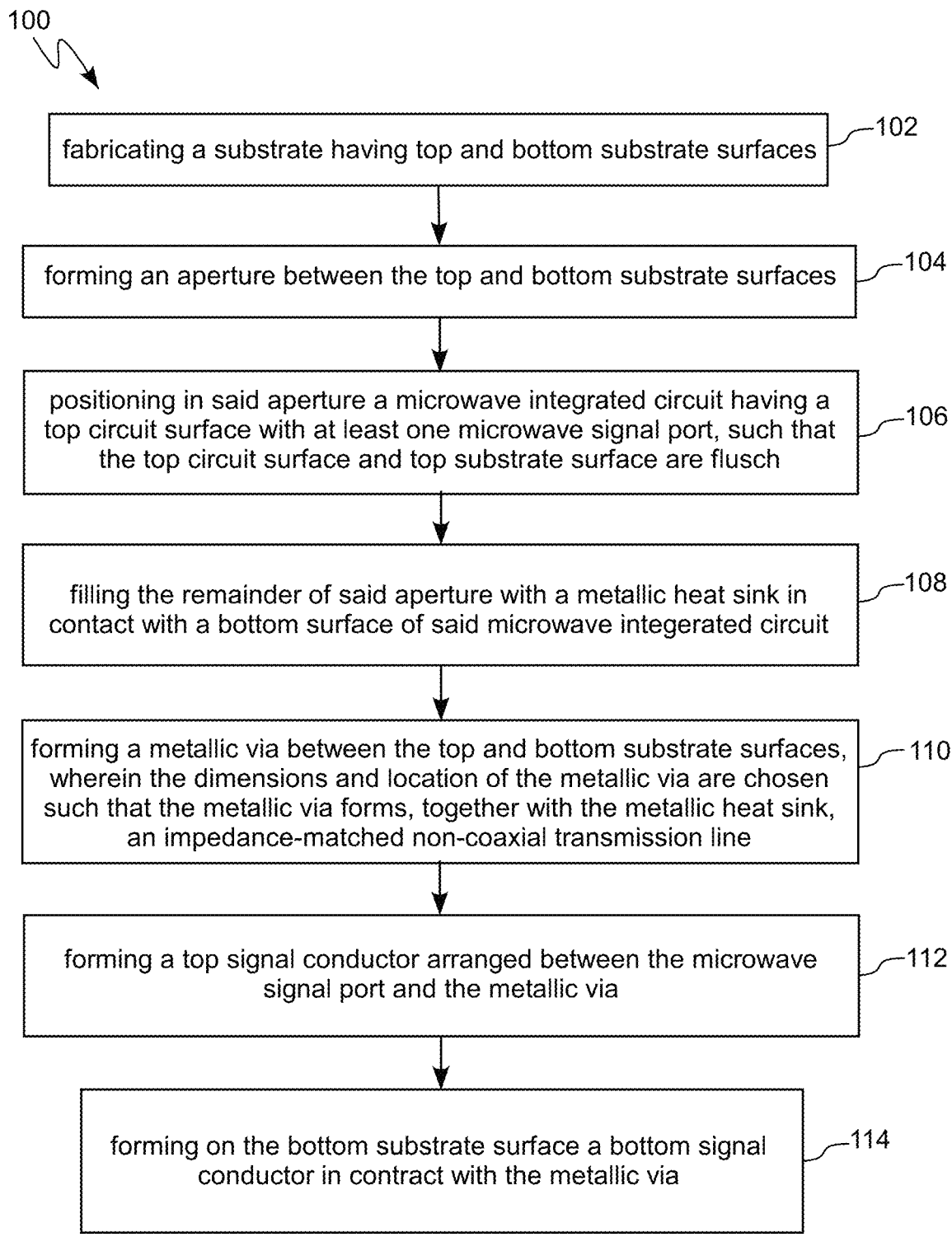
FIG. 7 illustrates a method of manufacturing a microwave electronic component according to an embodiment of this presentation.

FIG. 7 illustrates a method 100 according to embodiments of this presentation, the method comprising: fabricating 102 a substrate having top and bottom substrate surfaces and forming 104 in the substrate an aperture between the top and bottom substrate surfaces. According to embodiments of this presentation, the method further comprises positioning 106 in the substrate aperture a microwave integrated circuit having a top circuit surface with at least one microwave signal port such that the top circuit surface and top substrate surface are flush, and filling 108 the remainder of said aperture with a metallic heat sink such that at least a bottom surface of said microwave integrated circuit is in contact with the metallic heat sink. This can be done by temporarily attaching the top substrate surface and the top circuit surface to a handle wafer; covering the interior of the aperture and the bottom of the integrated circuit with a precursor metal and filling the interior of the aperture using a metal plating process. The method further comprises forming 110 a metallic via between the top and bottom substrate surfaces wherein the dimensions and location of the metallic via are chosen, as detailed above, such that the metallic via forms, together with the metallic heat sink, an impedance-matched non-coaxial transmission line. According to an embodiment of this presentation, the method further comprises forming 112 a top signal conductor between the microwave signal port and the metallic via, and forming 114 a bottom signal conductor in contact with the metallic via. According to embodiments of this presentation, the top and bottom signal conductors can each be provided to be part of a non-coaxial impedance-matched transmission line that also comprise grounded conductors respectively on the top and bottom substrate surfaces, such as detailed previously.

Figure 8:
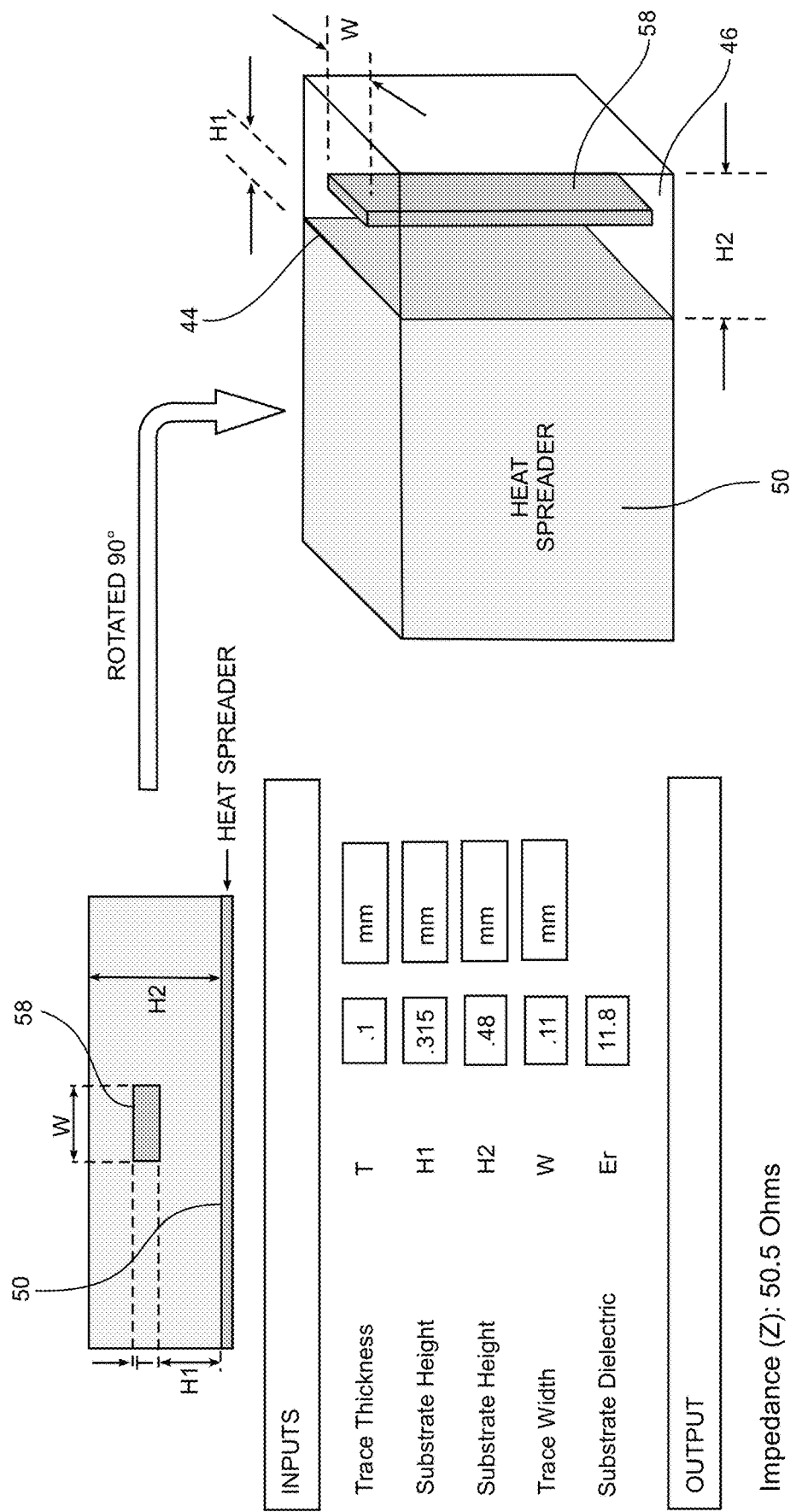
FIG. 8 illustrates an embodiment of a calculation tool similar to the tool in FIG. 4.

FIG. 8 illustrates an embodiment of a calculation tool (www.eeweb.com/tools/embedded-microstrip-impedance) similar to the tool in FIG. 4, showing that different dimensions than those shown in FIG. 4 can be used for via 58 to achieve a characteristic impedance of about 50 Ohm. FIG. 8 further comprises a perspective view of a portion of a component according to this presentation, illustrating what dimensions of via 58 are important to achieve the desired characteristic impedance.

Applicant has made this disclosure with respect to the current state of the art, but also contemplates advancements and that adaptations in the future may take into consideration of those advancements, namely in accordance with the then current state of the art. It is intended that the scope of the invention be defined by the claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . ." and no method or process step herein is to be construed under those provisions unless the step, or steps, are expressly recited using the phrase "comprising the step(s) of . . .".

What is claimed is:

1. A microwave electronic component comprising:
    a substrate having top and bottom substrate surfaces; the substrate comprising an aperture between the top and bottom substrate surfaces;
    a metallic heat sink filling the aperture;
    a microwave integrated circuit having a top circuit surface with at least one microwave signal port and a bottom circuit surface in contact with the metallic heat sink;
    a signal line comprising at least a metallic via between the top and bottom substrate surfaces, and a top signal conductor arranged between the microwave signal port and the metallic via; wherein
    the dimensions and location of the metallic via are chosen such that the metallic via forms, together with the metallic heat sink, a first impedance-matched non-coaxial transmission line.

2. The microwave electronic component of claim 1, wherein said top substrate surface comprises a top ground plane conductor in contact with the metallic heat sink and wherein said top signal conductor is arranged at least partially on the top substrate surface such that said top signal conductor forms, together with the top ground plane conductor, a second impedance-matched non-coaxial transmission line.

3. The microwave electronic component of claim 2, wherein said top ground plane conductor is arranged to form a ground-signal-ground topology together with said top signal conductor.

4. The microwave electronic component of claim 2, wherein said bottom substrate surface comprises a bottom ground plane conductor in contact with the metallic heat sink and wherein the signal line further comprises a bottom signal conductor arranged on the bottom substrate surface such that said bottom signal conductor forms, together with the bottom ground plane conductor, a third impedance-matched non-coaxial transmission line.

5. The microwave electronic component of claim 4, wherein said bottom ground plane conductor is arranged to form a ground-signal-ground topology together with said bottom signal conductor.

6. The microwave electronic component of claim 1, wherein said microwave integrated circuit is embedded in the metallic heat sink such that said top circuit surface is flush with said top substrate surface.

7. The microwave electronic component of claim 6, wherein said top signal conductor forms a bridge over a portion of the metallic heat sink located between the signal port and the metallic via.

8. The microwave electronic component of claim 1, wherein said at least one microwave signal port is one of an input port and an output port.

9. The microwave electronic component of claim 1, comprising a cap attached to the top substrate surface over the microwave integrated circuit; the cap comprising a recess arranged such that the cap does not contact the microwave integrated circuit.

10. The microwave electronic component of claim 1, wherein said dimensions and location of the metallic via comprise:
    a thickness and width of the metallic via in a plane parallel to the top and bottom substrate surfaces;
    a distance between the metallic via and a closest wall of the metallic heat sink in said plane along a direction normal to said closest wall of the metallic heat sink; and
    a distance between the metallic via and a lateral edge of the substrate along said direction.

11. The microwave electronic component of claim 1, wherein the first impedance-matched non-coaxial transmission line has a characteristic impedance of 50 Ohm+/−5%.

12. A method of manufacturing a microwave electronic component, the method comprising:
    fabricating a substrate having top and bottom substrate surfaces; the substrate comprising an aperture between the top and bottom substrate surfaces;
    positioning in said aperture a microwave integrated circuit having a top circuit surface with at least one microwave signal port such that the top circuit surface and top substrate surface are flush;
    filling the remainder of said aperture with a metallic heat sink such that at least a bottom surface of said microwave integrated circuit is in contact with the metallic heat sink;
    forming a signal line comprising at least a metallic via between the top and bottom substrate surfaces, and a top signal conductor arranged between the microwave signal port and the metallic via; wherein the dimensions and location of the metallic via are chosen such that the metallic via forms, together with the metallic heat sink, a first impedance-matched non-coaxial transmission line.

13. The method of claim 12, further comprising forming on said top substrate surface a top ground plane conductor in contact with the metallic heat sink, wherein said top signal conductor is arranged at least partially on the top substrate surface such that said top signal conductor forms, together with the top ground plane conductor, a second impedance-matched non-coaxial transmission line.

14. The method of claim 13, comprising arranging said top ground plane conductor to form a ground-signal-ground topology together with said top signal conductor.

15. The method of claim 13, further comprising forming on said bottom substrate surface a bottom ground plane conductor in contact with the metallic heat sink;
   wherein said forming a signal line further comprises forming on the bottom substrate surface a bottom signal conductor arranged to form, together with the bottom ground plane conductor, a third impedance-matched non-coaxial transmission line.

16. The method of claim 15, comprising arranging said bottom ground plane conductor to form a ground-signal-ground topology together with said bottom signal conductor.

17. The method of claim 12, comprising forming said top signal conductor as a bridge over a portion of the metallic heat sink located between the signal port and the metallic via.

18. The method of claim 12, comprising attaching to the top substrate surface, over the microwave integrated circuit, a cap comprising a recess arranged such that the cap does not contact the microwave integrated circuit.

19. The method of claim 12, wherein said dimensions and location of the metallic via comprise:
   a thickness and width of the metallic via in a plane parallel to the top and bottom substrate surfaces;
   a distance between the metallic via and a closest wall of the metallic heat sink in said plane along a direction normal to said closest wall of the metallic heat sink; and
   a distance between the metallic via and a lateral edge of the substrate along said direction.

20. The method of claim 12, comprising forming simultaneously the metallic heat sink and metallic via using an electroplating process.

\* \* \* \* \*